(12) United States Patent
Xuan et al.

(10) Patent No.: US 7,602,831 B2
(45) Date of Patent: Oct. 13, 2009

(54) SEMICONDUCTOR LASER DEVICE HAVING AN INSULATION REGION

(75) Inventors: Rong Xuan, Hsinchu Hsien (TW);
Yao-Lin Huang, Hsinchu (TW);
Yu-Chen Yu, Hsinchu (TW); Yen Chu, Hsinchu (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 11/453,100

(22) Filed: Jun. 15, 2006

(65) Prior Publication Data

US 2006/0285570 A1 Dec. 21, 2006

(30) Foreign Application Priority Data

Jun. 16, 2005 (TW) .............................. 94119955 A

(51) Int. Cl.
*H01S 3/098* (2006.01)
*H01S 5/00* (2006.01)
*H01S 3/14* (2006.01)

(52) U.S. Cl. ........................... 372/68; 372/19; 372/50.1

(58) Field of Classification Search .................. 372/68, 372/19, 50.1
See application file for complete search history.

(56) References Cited

U.S. PATENT DOCUMENTS

| 4,622,471 A | 11/1986 | Schroeder | |
| 4,734,380 A | 3/1988 | Tsang | |
| 4,779,282 A * | 10/1988 | Ng | 372/46.01 |
| 4,794,608 A | 12/1988 | Fujita et al. | |
| 4,835,783 A * | 5/1989 | Suyama et al. | 372/46.01 |
| 6,181,717 B1 * | 1/2001 | Kner et al. | 372/20 |
| 6,978,057 B1 | 12/2005 | O'Gorman et al. | |
| 2003/0169792 A1 * | 9/2003 | Kim | 372/45 |
| 2006/0126693 A1 | 6/2006 | Kwon et al. | |

FOREIGN PATENT DOCUMENTS

JP 60-219786 A 11/1985
WO WO-2005/117302 A1 12/2005

* cited by examiner

*Primary Examiner*—Minsun Harvey
*Assistant Examiner*—Patrick Stafford
(74) *Attorney, Agent, or Firm*—Birch, Stewart, Kolasch & Birch, LLP

(57) ABSTRACT

A semiconductor laser device includes a substrate having a first surface and a second surface opposite to the first surface, an active region formed on the second surface of the substrate, a cladding layer formed on the active region, and an insulation region formed in the cladding layer to form on the second surface of the substrate a first laser region having a first size and a second laser region having a second size different from the first size. The first laser region is used for generating a first optical spectrum having a first laser mode channel space. The second laser region is used for generating a second optical spectrum having a second laser mode channel space. A combination of the first optical spectrum and the second optical spectrum forms a single mode laser. Without any gratings, the semiconductor laser device is easy to be fabricated and has a low fabrication cost.

21 Claims, 4 Drawing Sheets

SEMICONDUCTOR LASER DEVICE HAVING AN INSULATION REGION

BACKGROUND OF THE INVENTION

1. Field of the Invention

The present invention relates generally to semiconductor laser devices, and more particularly, to a single mode semiconductor laser device having an insulation region in place of a grating.

2. Description of Related Art

The technology employing semiconductor optical component (semiconductor laser) as optical communication component is originated in the 80's in Bell laboratories. Nowadays, the study is more concentrated on how to make the semiconductor optical component (i.e. semiconductor laser) exert the capability of high-speed carrier signal and long-range transportation. Based on such application, the capability of the basic transportation signal according to the semiconductor laser component is all through the task continuously researched in such industry. In the conventional laser diode, its optical cavity is paralleled with epitaxial layer, the reflecting surface is formed after plating the reflecting mask on the crystal natural fracture surface and plumed with the epitaxial layer, the ray between both sides of the mirror surface of the active region reflects back and forth, then produces multi-mode laser ray from the side.

In present optical communication system, the pursuit of high speed and large capability has become the eternal target in the development of optical communication, single mode laser component is produced conforming to the demand, and among many features of the semiconductor laser, the single mode spectrum output which determines the distance of the signal transportation is one of the most important features of the semiconductor laser.

In order to form laser with single output wavelength, nowadays, grating integrated in the semiconductor laser component is mostly adopted in such industry, so that single mode laser is formed through the optical output with certain wavelength by the frequency selection function of the grating. For example, U.S.A. Publication No.20030169792 proposed a DBR Distributed Bragg Reflector (DBR) laser, with reference to FIG. 1. The DBR laser comprises a first grating section 220, a second grating section 240, an active section 230, a first cladding layer 120, a second cladding layer 180, a first waveguide layer 140, a second waveguide layer 160, an active layer 130, a first top electrode 190, a second top electrode 200, a third top electrode 210, and a bottom electrode 110.

The first cladding layer 120 is an n-type InP substrate. The bottom electrode 110 is formed on a bottom surface of the first cladding layer 120. The second cladding layer 180 is a p-type InP substrate.

The active layer 130 is formed on the active section 230. When an electric field is applied to the active section 230, electrons in the active section 230 will be drifted from the first cladding layer 120 to the active layer 130, and holes in the active section 230 will be drifted from the second cladding layer 180 to the active layer 130. The electrons and holes drifted to the active layer 130 are combined to form optical signals.

The first waveguide layer 140 is formed in the first grating section 220 and is disposed on one side of the active layer 130. A plurality of first gratings 150 are formed on a top surface of the first waveguide layer 140. Optical signals traveling from the active layer 130 onto the first waveguide layer 140 and having a first predetermined wavelength are allowed to pass through the first gratings 150, which is capable of performing a frequency selection function.

The second waveguide layer 160 is formed in the second grating section 240 and disposed on another side of the active layer 130. A plurality of second gratings 170 are formed on a top surface of the second waveguide layer 160. Optical signals traveling from the active layer 130 onto the second waveguide layer 160 and having a second predetermined wavelength are allowed to pass through the second gratings 170, which is also capable of performing the frequency selection function.

The first top electrode 190, the second top electrode 200 and the third top electrode 210 are all formed on the second cladding layer 180, and disposed in the first optical grating section 220, the active section 230 and the second grating section 240 respectively.

The DBR laser can produce single mode laser ray by employing grating to filter, and achieve the purpose of tuning the output optical wavelength by adjusting the electric field density produced between the first top electrode 190, the second top electrode 200, the third top electrode 210 and the bottom electrode 110, thereby the structure, design and fabrication of the grating is key quality of the. But it is need to use high fabrication precision to filter in the DBR laser, and the grating fabricating process is complex, so that the fabricating process of the DBR laser becomes complex, the time of the fabricating process and the cost of the fabricating process increase, meanwhile, due to the requirement for the extremely high precision of the grating, the fabricating time to yield of the semiconductor laser with grating correspondingly reduces, furthermore, the purpose of tuning the output optical wavelength can not be achieved, unless the power supply is simultaneously imposed on the first top electrode 190, the second top electrode 200 and the third top electrode 210, and the size of the semiconductor laser increases because the grating is integrated in the semiconductor laser, thus, such laser could not conform to the micromation development tread of the present electronic products and the requirement for continually upgrading the features.

American Patent Publication No.4622471 further proposes a multicavity optical device, which makes the principle of coupling the cavity with the laser apply in the semiconductor laser to produce single mode laser ray, but the device can not tune the output optical wavelength, and the first laser region and the second laser region of the device are unattached, single mode laser could not be produced until the power supply is simultaneously imposed on the first and second laser regions, furthermore, the first and second laser regions in the device are mounted on the surface of the substrate through the SMT (Surface Mounting Technology) fabrication, and single mode laser with good performance can not be produced until the relative position of the first and second laser regions is extremely accurate, so that the difficulty degree and the cost of the fabricating process increase.

American Patent Publication No.6978057 further proposes an optical waveguide and a method for providing an optical waveguide. A laser diode (1) having an optical path (15) defined in an active layer (2) which is sandwiched between a substrate layer (3) and a top layer (4) and defined by a ridge (14) formed in the top layer (4) outputs laser light of a single predetermined wavelength. Refractive index altering grooves (21) extending transversely in the top layer (4) are provided at spaced apart locations for altering the refractive index of the active layer (2) along the optical path at partial reflecting locations (20) for causing partial longitudinal reflections of the laser light generated in the optical path (15) so that standing waves or harmonics thereof of the single predetermined wavelength are set up between the respective partial reflecting locations (20) and a first mirror facet (8) in the optical path (15). In order that the standing waves set up between the partial reflecting locations (20) and the first mirror facet (8) are harmonics of the predetermined single wavelength, the refractive index altering grooves (21) are located along the ridge (14) for forming the reflecting locations (20) at distances from the first mirror facet (8) which correspond to the effective length of the optical path (15) resulting from the affect of the inclusion of the reflecting locations (20) rather than at locations corresponding to the actual length of the light path (15).

Accordingly, there exists a strong need in the art for a semiconductor laser device to solve the drawbacks such as complex fabricating process, low fabricating time to yield and high cost caused by the conventional technology employing grating, and the drawbacks such as the complicated fabricating process and the increasing cost caused by the conventional technology which could not tune the output wavelength.

SUMMARY OF THE INVENTION

Accordingly, it is a primary objective of the present invention to solve the problems of the aforementioned conventional technology by providing a semiconductor laser device which is capable of generating single mode laser having a tunable wavelength.

It is another objective of the present invention to provide a semiconductor laser device which is easy to be fabricated.

It is a further objective of the present invention to provide a semiconductor laser device of low fabrication cost.

It is yet another objective of the present invention to provide a semiconductor laser device which upgrades the device performance and conforms to the micromation development tread of the electronic products.

In order to attain the object mentioned above and the others, a semiconductor laser device according to the present invention includes a substrate having a first surface and a second surface opposite to the first surface, an active region formed on the second surface of the substrate, a cladding layer formed on the active region, and an insulation region formed in the cladding layer to form on the second surface of the substrate a first laser region having a first size and a second laser region having a second size different from the first size. The first laser region is used for generating a first optical spectrum having a first laser mode channel space. The second laser region is used for generating a second optical spectrum having a second laser mode channel space. A combination of the first optical spectrum and the second optical spectrum forms a single mode laser. The semiconductor laser device further includes a first electrode formed on the first surface of the substrate, a second electrode formed on an external surface of the first laser region, and a third electrode formed on the external surface of the second laser region.

In the above-described semiconductor laser device, the single mode laser is formed by injecting currents into either of the first laser region and the second laser region. Furthermore, the single mode laser of the present invention has a wavelength capable of being modulated by injecting a constant current into the first laser region (or the second laser region), and injecting a variable current into the second laser region (or the first laser region). The single mode laser has a wavelength capable of being modulated by adjusting an operating temperature of the semiconductor laser device to drift wavelengths of the first optical spectrum generated from the first laser region and the second optical spectrum generated from the second laser region, so as to achieve the purpose of the tunable output wavelength.

Compared with the prior art, the semiconductor laser device according to the present invention has the insulation region formed in the cladding layer to form on the second surface of the substrate the first laser region and the second laser region, which is unequal to the first laser region in size. Therefore, when power supply is provided to the semiconductor laser device, a first optical spectrum having a first laser mode channel space and a second optical spectrum having a second laser mode channel space are in the first laser region and the second laser region respectively, and a combination of the first optical spectrum and the second optical spectrum forms the single mode laser. The single mode laser has a tunable wavelength, and the wavelength can be modulated by injecting a constant current into the first laser region (or the second laser region), and injecting a variable current into the second laser region (or the first laser region). In conclusion, even without any gratings, the semiconductor laser device according to the present invention can still form the single mode laser with tunable wavelength. Therefore, the fabrication process to fabricate the semiconductor laser device is simplified, and the semiconductor laser device has a low fabrication cost. The drawbacks of the prior art, such as low precision of the relative position of the first and second laser regions on the substrate and the effect without forming tunable wavelength caused by the conventional technology due to the use of SMT (Surface Mounting Technology) fabrication, can be solved.

DETAILED DESCRIPTION OF THE PREFERRED EMBODIMENTS

The following description contains specific information pertaining to the implementation of the present invention. One skilled in the art will readily recognize other advantages and features of the present invention after reviewing what specifically disclosed in the present application. It is manifest that the present invention can be implemented and applied in a manner different from that specifically discussed in the present application. It should also be understood that the invention is not limited to the particular exemplary embodiments described herein, but is capable of many rearrangements, modifications, and substitutions without departing from the spirit of the present invention.

Figure 1:
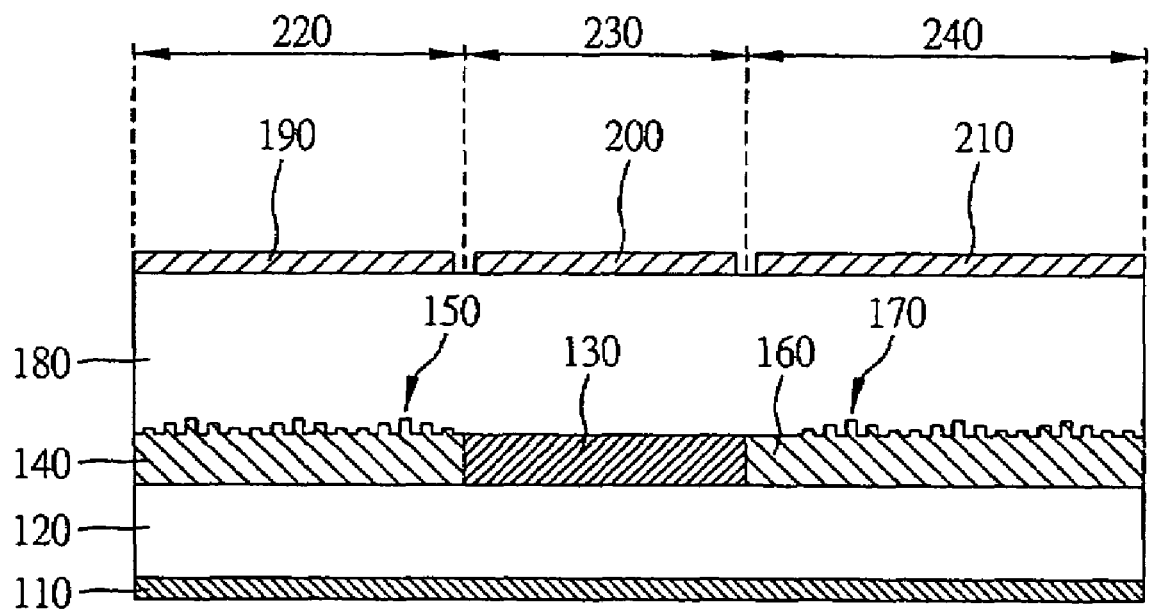
FIG. 1 is a cross-sectional view of a Distributed Bragg Reflector (DBR) laser according to the prior art.
Figure 2:
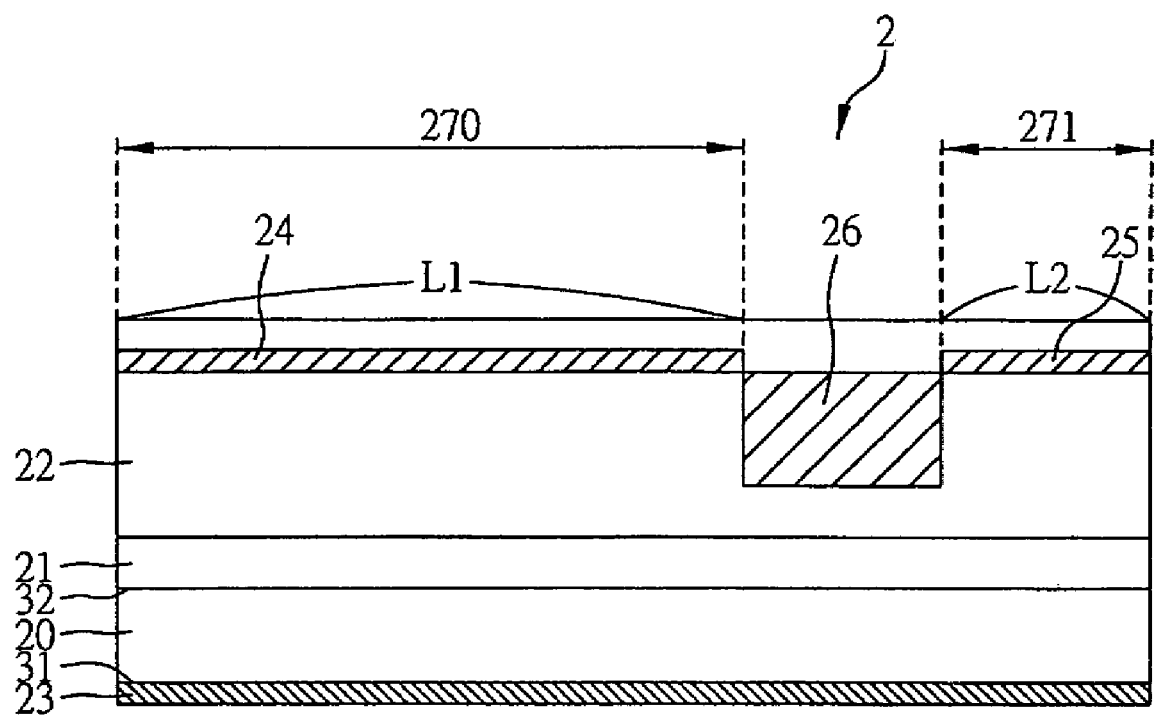
FIG. 2 is a cross-sectional view of a semiconductor laser device of the preferred embodiment according to the present invention.

FIG. 2 is a cross-sectional view of a semiconductor laser device 2 of the preferred embodiment according to the present invention. Please note that the drawings are all simplified schematic diagrams and merely illustrate the basic structure according to the present invention should be paid to, in such drawings, they merely illustrate the components pertaining to the invention, and the illustrated components may not be in the state of the actual exemplary embodiments, the number of the components, shape or proportion of size when actually implementing is a selective design, the layout of the component may be more complex.

The semiconductor laser device 2 comprises a substrate 20, an active region 21, a cladding layer 22, an insulation region 26, a first electrode 23, a second electrode 24 and a third electrode 25.

The substrate 20 is a p-type (n-type) InP substrate, and includes a first surface 31 and a second surface 32 opposite to the first surface 31. The substrate 20 has a refractive index far smaller than a refractive index of the active region 21. The first electrode 23 is formed on the first surface 31 of the substrate 20.

The active region 21 is formed on the second surface 32 of the substrate 20, and is made of a semiconductor material, such as InGaAs, AlInGaAs, GaAs, GaAsN and InGaAsP etc. The active region 21 therefore, has a population inversion characteristic and a large refractive index. The semiconductor laser device 2 comprises an optical cavity (not shown), in which light oscillate back and forth to resonance and to be amplified, so as to form laser. The active region 21 comprises an active section layer and a separate confinement heterostructure (SCH) structure covered on a top surface and a bottom surface of the active section layer. The SCH structure is not specifically illustrated by the drawings and is not specifically described in the present application, because it is apparent for a person of ordinary skill in the art.

The cladding layer 22 is formed on the active region 21 and is a p-type (n-type) InP substrate. The cladding layer 22 has a refractive index far smaller than the refractive index of the active region 21. The cladding layer 26 has a thickness larger than a depth of the insulation region 26 (in order to simplify the drawings and related description, the thickness of the cladding layer 22 is assumed to be larger than the depth of the depth of the insulation region 26, but is not limited to case). A first laser region 270 having a first size is formed on one side of the second surface 32 of the substrate 20, and a second laser region 271 having a second size different from the first size is formed on the other side of the second surface 32 of the substrate 20. The second electrode 24 is formed on an external surface of the first laser region 270, and the third electrode 25 is formed on an external surface of the second laser region 271.

According to the preferred embodiment the first laser region 270 is defined as a region to mainly emit laser, and the second laser region 271 is defined as another region to mainly filter laser. Since the first laser region 270 is different from the second laser region 271 in size (the first laser region 270 has a first length L1, and the second laser region 271 has a second length L2, which is shorter than the first length L1), a first laser mode channel space of a first laser optical spectrum generated from the first laser region 270 is different from a second laser mode channel space of a second laser optical spectrum generated from the second laser region 271, and a combination of the first laser optical spectrum and the second laser optical spectrum forms a single mode laser. A first laser resonance condition of the first laser region 270 is shown in eq.1, a second laser resonance condition of the second laser region 271 is shown in eq.2, and a coupling condition between the first laser region 270 and the second laser region 271 is shown in eq.3:

$$\lambda_1 = \lambda^2/2n_{eff}*L1.  \quad \text{eq.1}$$

$$\lambda_2 = \lambda^2/2n_{eff}*L2.  \quad \text{eq.2}$$

$$\lambda_{12} = \lambda^2/[2n_{eff}*(L1-L2)]  \quad \text{eq.3}$$

Where $\lambda$ indicates a wavelength of the light (wavelength in the air), $n_{eff}$ indicates an effective refractive index in a laser region, $\lambda_1$ indicates the first laser mode channel space of the first laser region 270, $\lambda_2$ indicates the second laser mode channel space of the second laser region 271, $\lambda_{12}$ indicates a difference between the first laser mode channel space and the second laser mode channel space, i.e. a coupled mode space. Therefore, the coupled mode space $\lambda_{12}$ can be controlled by adjusting a ratio between the first length L1 of the first laser region 270 and the second length L2 of the second laser region 271, and the single mode laser can be generated (i.e. the three equations eq.1, eq.2 and eq.3 are satisfied at the same time).

Figure 3A:
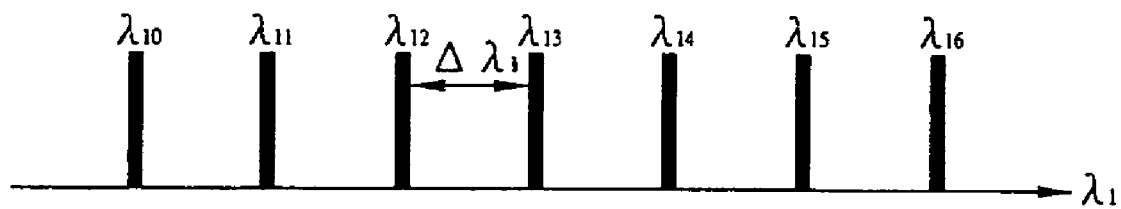
FIGS. 3A through 3C are spectrums of three single mode lasers formed by the semiconductor laser device shown in FIG. 2.
Figure 3B:
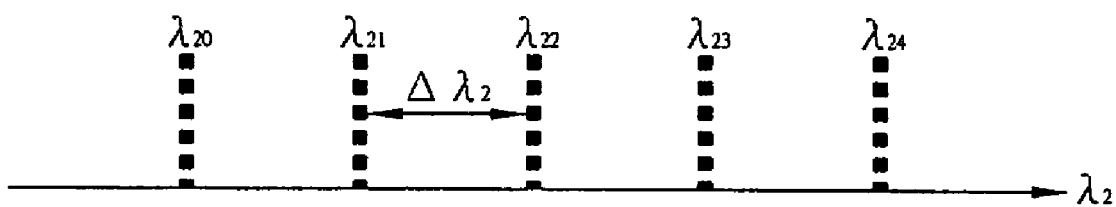
Figure 3C:
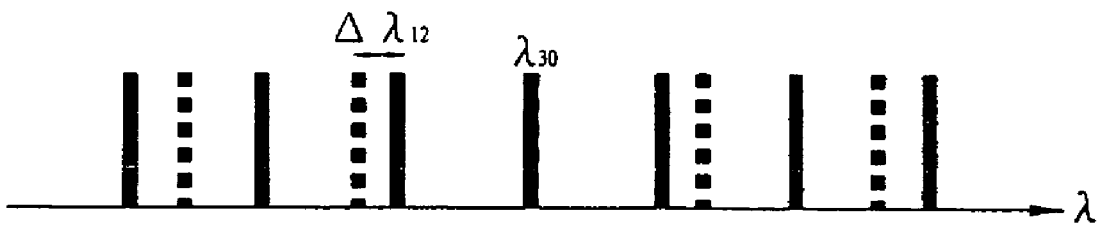

FIGS. 3A and 3B, are two spectrums of a first multi-mode laser $\lambda_1$ (composed of $\lambda_{10}, \lambda_{11}, \lambda_{12}, \lambda_{13}, \lambda_{14}, \lambda_{15}, \lambda_{16}$) generated from the first laser region 271, and a second multi-mode laser $\lambda_2$ (composed of $\lambda_{20}, \lambda_{21}, \lambda_{22}, \lambda_{23}, \lambda_{24}$) generated from the second laser region 271. The first multi-mode laser $\lambda_1$ has a first laser mode channel space $\lambda_1$, the second multi-mode laser $\lambda_2$ has a second laser mode channel space $\lambda_2$, and a combination of the first multi-mode laser $\lambda_1$ and the second multi-mode laser $\lambda_2$ forms the single mode laser, which is shown in FIG. 3C. As shown in FIG. 3C, only those laser optical signals having wavelengths $\lambda_{12}$ and $\lambda_{13}$, both of which satisfy eqs. 1-3, are combined to form the single mode laser, which has a wavelength $\lambda_{12}$.

The insulation region 26 is formed by implanting ions into a certain region of the cladding layer 22 through the use of an ion transportation method or a focus ion beam method. Both the ion transportation method and a focus ion beam method are well known to a person of ordinary skill in the art, further description hereby omitted. Furthermore, in the preferred embodiment, a gap is formed in advance in the cladding layer 22 through the use of Photonic crystal, chemical etching or dry etching. The thickness of the cladding layer 22 is larger than a depth of the space. A dielectric material, such as $SiO_x$, $SiN_x$, and polymer, is then filled into the gap, to therefore from insulation region 26 in the cladding layer 22. Through the formation of the insulation region 26, the first laser region 270, and the second laser region 271 as well, are formed on the substrate 20. Moreover, since the insulation region 26 does not penetrate through the active region 21, the first laser region 270 is connected to the second laser region 271. Even though, the first laser region 270 and the second laser region 271 still function independently, and satisfy the eqs. 1 and 2 respectively.

Furthermore, the insulation region 26 has to be designed wide enough to ensure the second electrode 24 formed on the first laser region 270 is insulated from the third electrode 25 formed on the second laser region 271. The depth of the insulation region 26 has to be determined by a confinement factor (.) of the semiconductor laser device 2 per se. The larger the confinement factor is, the deeper the insulation region 26 should be designed, and vice versa.

In order to further indicate the principal and feature of the present invention, the single mode laser output and the mechanism of tunable single mode laser according to the present invention will be described below.

With reference to FIG. 2, when a power supply is applied to the second electrode 24 and the first electrode 23 (i.e. currents are injected into the first laser region 270), majority of the electrons in the cladding layer 22 (or the substrate 20) of the first laser region 270 are drifted from the cladding layer 22 (or the substrate 20) to the active region 21 in the first laser region 270, and majority of the holes in the substrate 20 (or the cladding layer 22) are drifted from the substrate 20 (or the cladding layer 22) to the active region 21. In such a scenario, the electrons and the holes drifted to the active region 21 are combined to form optical signals, most of them having different wavelengths. The optical signals oscillate back and forth in the active region, and resonate to be amplified, and the multi-mode laser is generated. The single mode laser is next generated by virtue of a filtering process performed by the second laser region 271. The first lengths L1 of the first region 270 is different from the second length L2 of the second laser region 271, so only those optical signals having a predetermined wavelength are allowed to pass through the second laser region 271, which acts as an optical filter. Therefore, the semiconductor laser device 2 generates the single mode laser by injecting currents into the first laser region 270 and filtering optical signals in the second laser region 271. The present invention can be also designed that the second length L2 of the second laser region 271 is larger than the first length L1 of the first laser region 270, the multi-mode laser is therefore generated in the second laser region 271 by applying the power supply to the first electrode 23 and the third electrode 25, and the single mode laser is to be generated from the first laser region 270 through filtering process.

Figure 4A:
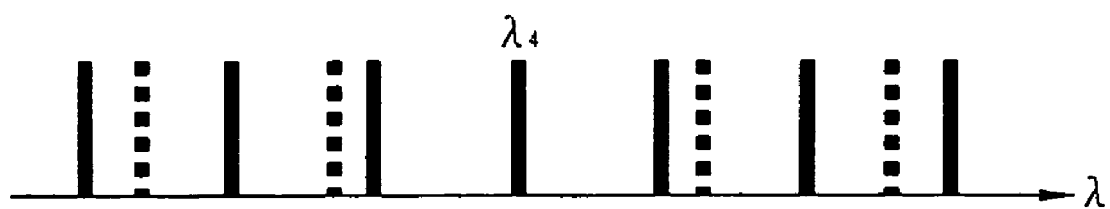
FIGS. 4A through 4C are spectrums of three single mode lasers having tunable wavelengths formed by the semiconductor laser device shown in FIG. 2.
Figure 4B:
Figure 4C:
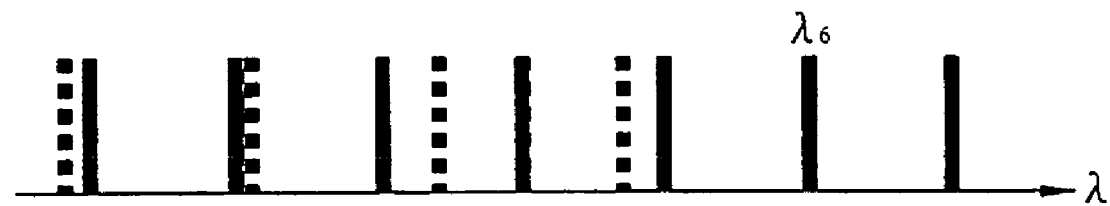

In addition, the present invention can achieve the effect of tuning wavelength of the single mode laser by synchronously applying the power supply to the first laser region 270 and the second laser region 271. With reference to FIGS. 4A, 4B and 4C, a first current injected into the first laser 270 is kept constant, while a second current injected into the second laser region 271 is variable, and the effective refractive index of the second laser region 271 becomes smaller (or larger), so a mode space of the second laser region 271 becomes smaller (or larger) accordingly. Therefore, the generated single mode laser has different wavelengths($._4$, $._5$, $._6$) through the combination of the optical spectrums of the first laser region 270 and the second laser region 271, and the dual purpose of the single mode laser output and the tunable wavelength is achieved. Similarly, altering the injecting current of the first laser region 270 to keep the injecting current of the second laser region 271 invariable, which can also achieve the purpose of tuning wavelength, its principal is identical to the above-described principal of altering the current of the second laser region 271 to tune wavelength, thus, here will not be repeated again.

Furthermore, since the effective refractive index of the laser optical signal is changed if an operating temperature of the semiconductor laser device 2 is changed, and the first length L1 of the first laser region 270 is different from the second length L2 of the second laser region 270, heat accumulated and a change on an effective refractive index in the first laser region 270 is different from those in the second laser region 271. Therefore, the single mode laser having different wavelengths can be filtered.

Accordingly, the semiconductor laser device according to the present invention mainly includes a substrate, an active region formed on the substrate and a cladding layer formed on the active region, its feature is that at least an insulation region is formed in the cladding layer of the semiconductor laser device, the first laser region and the second laser region with different size and connecting with each other are formed on the substrate, then single mode laser ray is formed after coupling the laser optical spectrums respectively produced by the first laser region and the second laser region. The present invention can also produce single mode laser with tunable wavelength by imposing the current and altering the operating temperature, thereby simplifying the fabrication, upgrading the time to yield of the fabrication and greatly reducing the fabrication cost, and concurrently conforming to the micromation development tread of the electronic products.

Compared with the conventional technology, the semiconductor laser device according to the present invention employs the ion transportation method, FIB (focus ion beam) method or etching fabrication to form the first and second laser regions with different sizes in the semiconductor laser device, single mode laser with certain wavelength is produced by coupling the multi-mode laser rays formed by the first and second laser regions. Thus, in the present invention, single mode laser can be formed by filtering without using the grating, thereby avoiding the drawbacks such as complex fabricating process, the significant reducing of the fabricating time to yield and the increasing fabrication cost caused by the conventional technology employing grating, and also avoiding the drawback that the product could not conform to the micromation development tread of the present electronic products, furthermore, in the present invention, multi-mode laser can be produced by injecting the current into the electrode of the first laser region (the second laser region), and then single mode laser can be produced by filtering in the second laser region (or the first laser region), so the effect of single mode laser output can be achieved just by simply operating on the single electrode, thereby avoiding the drawbacks such as complex operation and the increasing energy consumption caused by the conventional technology ,since the single mode laser can not be produced until multielectrode is operated synchronously. Furthermore, the semiconductor laser device according to the present invention has higher performance, because it is fabricated by the epitaxial technology, thereby avoiding the drawback in the conventional technology such as low precision of the relative position and then causing the performance of product reduce, which are caused by employing the SMT (Surface Mounting Technology) fabrication to mount the first and second laser regions formed in advance on the substrate, meanwhile, in the semiconductor laser device according to the present invention, the effect with tunable wavelength can be produced by operating the injecting current or changing the operating temperature through the electrode, thereby avoiding the drawback that the tunable wavelength can not be produced in the conventional technology, because two laser regions positioned on the substrate are separate from each other.

The above-described exemplary embodiments are to describe various objects and features of the present invention as illustrative and not restrictive. A person of ordinary skill in the art would recognize that changes could be made in form and detail without departing from the sprit and the scope of the invention. Thus, the right protection scope of the present invention should fall within the appended claim.

What is claimed is:

1. A semiconductor laser device comprising:
   a substrate having a first surface and a second surface opposite to the first surface;
   an active region formed on the second surface of the substrate;
   a cladding layer formed on the active region;
   an insulation region embedded in the cladding layer and extending in a direction perpendicular to the surfaces of the substrate and toward the active region, wherein only an upper surface of the insulation region is exposed to an outside of the device;
   a first laser region having a first size disposed on one portion of an exposed surface of the cladding layer; and
   a second laser region having a second size different from the first size disposed on another portion of the exposed surface of the cladding layer,
   wherein the first laser region is adapted to generate a first optical spectrum having a first laser mode channel space, and the second laser region is adapted to generate a second optical spectrum having a second laser mode channel space, allowing a combination of the first optical spectrum and the second optical spectrum to form a single mode laser; and wherein the insulation region is embedded in the cladding layer in a position between the first and second laser regions.

2. The semiconductor laser device of claim 1, wherein the active region comprises an active section layer having a top surface and a bottom surface, and a separate confinement heterostructure (SCH) covered on the top surface and the bottom surface of the active section layer.

3. The semiconductor laser device of claim 1 further comprising:
a first electrode formed on the first surface of the substrate; and
a second electrode formed on an external surface of the first laser region.

4. The semiconductor laser device of claim 3 further comprising:
a third electrode formed on the external surface of the second laser region.

5. The semiconductor laser device of claim 1, wherein the first laser region is unequal to the second laser region in length.

6. The semiconductor laser device of claim 1, wherein the cladding layer has a thickness larger than a depth of the insulation region, and the first laser region is connected to the second laser region.

7. The semiconductor laser device of claim 1, wherein the insulation region is formed in the cladding layer by one selected from a group consisting of an ion transportation method and a focus ion beam method.

8. The semiconductor laser device of claim 1, wherein the insulation region is formed in the cladding layer by Photonic crystal or one selected from the group consisting of a chemical etching and a dry etching.

9. The semiconductor laser device of claim 8, wherein either of the chemical etching and the dry etching forms a space in the cladding layer, and fills a dielectric material in the space to form the insulation region between the first laser region and the second laser region.

10. The semiconductor laser device of claim 9, wherein the dielectric material is one selected from the group consisting of $SiO_x$, $SiN_x$, and polymer.

11. The semiconductor laser device of claim 1, wherein the single mode laser is formed by injecting currents into either of the first laser region and the second laser region.

12. The semiconductor laser device of claim 1, wherein the single mode laser has a wavelength capable of being modulated by injecting a constant first current into the first laser region, and injecting a variable second current into the second laser region.

13. The semiconductor laser device of claim 1, wherein the single mode laser has a wavelength capable of being modulated by injecting a variable first current into the first laser region, and injecting a constant second current into the second laser region.

14. The semiconductor laser device of claim 1, wherein the single mode laser has a wavelength capable of being modulated by adjusting an operating temperature of the semiconductor laser device to drift wavelengths of the first optical spectrum generated from the first laser region and the second optical spectrum generated from the second laser region.

15. The semiconductor laser device of claim 1, wherein the substrate is a p-type InP substrate.

16. The semiconductor laser device of claim 15, wherein the cladding layer is an n-type InP substrate.

17. The semiconductor laser device of claim 1, wherein the substrate is an n-type InP substrate.

18. The semiconductor laser device of claim 17, wherein the cladding layer is a p-type InP substrate.

19. The semiconductor laser device of claim 1, wherein the active region is made of a semiconductor material.

20. The semiconductor laser device of claim 19, wherein the semiconductor material is one selected from the group consisting of AlInGaAs and InGaAs, GaAs, GaAsN and InGaAsP.

21. The semiconductor laser device of claim 1, wherein the insulation region embedded into the cladding layer does not extend above an upper surface of the cladding layer.

* * * * *